US 9,187,684 B2

(12) United States Patent
McCants et al.

(10) Patent No.: US 9,187,684 B2
(45) Date of Patent: Nov. 17, 2015

(54) NANOFLUIDS FOR THERMAL MANAGEMENT SYSTEMS

(75) Inventors: Dale A. McCants, Ravenel, SC (US); Andrew M. Hayes, Silverspring, MD (US)

(73) Assignee: University of South Carolina, Columbia, SC (US)

(*) Notice: Subject to any disclaimer, the term of this patent is extended or adjusted under 35 U.S.C. 154(b) by 921 days.

(21) Appl. No.: 12/728,637

(22) Filed: Mar. 22, 2010

(65) Prior Publication Data
US 2010/0288472 A1   Nov. 18, 2010

Related U.S. Application Data (60) Provisional application No. 61/161,822, filed on Mar. 20, 2009.

(51) Int. Cl.
| | |
|---|---|
| C09K 5/00 | (2006.01) |
| C09K 5/10 | (2006.01) |
| C09K 5/08 | (2006.01) |
| F28D 15/00 | (2006.01) |
| F28F 13/00 | (2006.01) |
| G06F 1/20 | (2006.01) |
| H01L 23/473 | (2006.01) |

(52) U.S. Cl.
CPC ... *C09K 5/10* (2013.01); *C09K 5/08* (2013.01); *F28D 15/00* (2013.01); *F28F 13/00* (2013.01); *G06F 1/20* (2013.01); *H01L 23/473* (2013.01); *G06F 2200/201* (2013.01); *H01L 2924/0002* (2013.01)

(58) Field of Classification Search
CPC .................................. C09K 5/10; C09K 5/08
USPC ............ 252/71, 73, 74, 75, 77; 977/773, 777, 977/786, 831; 165/185
See application file for complete search history.

(56) References Cited

U.S. PATENT DOCUMENTS

| | | | |
|---|---|---|---|
| 7,481,063 B2 | 1/2009 | Kitanovski et al. | |
| 2007/0034354 A1* | 2/2007 | Tung et al. .................. | 165/80.4 |
| 2007/0158609 A1 | 7/2007 | Hong et al. | |
| 2007/0158611 A1 | 7/2007 | Oldenburg | |
| 2008/0006040 A1 | 1/2008 | Peterson et al. | |

(Continued)

OTHER PUBLICATIONS

Tsung et al. "A novel nanofluid manufacturing process using a cylindrical flow cooling method in an induction heating system", Int. J. Adv. Manuf. Technol. (2006), 29: 99-104. published online Aug. 17, 2005.*

(Continued)

*Primary Examiner* — Jane L Stanley
(74) *Attorney, Agent, or Firm* — Dority & Manning, P.A.

(57) ABSTRACT

A nanofluid is generally provided for use in a heat transfer system. The nanofluid can include nanoparticles suspended in a base liquid at a nanoparticle concentration in the nanofluid of about 0.01% to about 5% by volume. The nanoparticles can include zinc-oxide nanoparticles. The nanofluid for use in a heat transfer system can, in One embodiment, further include a surfactant. Thermal management systems configured to cool a computer having integrated circuits that generate heat during use are also provided. The thermal management system can include a zinc-oxide nanofluid circurated through a series of tubes via a pump such that heat produced by electronic components of the computer can be captured by the circulating nanofluid and then removed from the nanofluid by a radiator.

5 Claims, 8 Drawing Sheets

(56) References Cited

U.S. PATENT DOCUMENTS

2008/0302998 A1* 12/2008 Hong et al. .................. 252/74
2010/0154406 A1   6/2010 Conard et al.
2012/0068326 A1   3/2012 Das et al.

OTHER PUBLICATIONS

Hong et al. "Effect of laser irradiation on thermal conductivity of ZnO nanofluids", Journal of Physics: Conference Series 59 (2007) 301-304.*

Kim et al. "Thermal conductivity of metal-oxide nanofluids: particle size dependence and effect of laser irradiation" Journal of Heat Transfer, vol. 129, Mar. 2007, p. 298-307.*

Zhang et al. "ZnO nanofluids—A potential antibacterial agent", Progress in Natural Science, 19 (2008), 939-944.*

Buongiomo. J, 2006 "Convective Transport in Nanofluids," *ASME J. Heat Transfer*. 128 pp. 240-250.

Hwang, Y. J., Ahn, Y.C., Shin, H. S., Lee, C. G., Kim, G. T., Park, H. S., Lee, J. K., 2005 "Investigation on Characteristics of Thermal Conductivity Enhancement of Nanofluids," *Current Applied Physics*, Article in Press.

Hwang, Y., et al., "Stability and Thermal Conductivity Characteristics of Nanofluids," *Thermochimica Acta*, Article in Press, 2006.

Incropera, F.P., et al., *Fundamentals of Heat and Mass Transfer*, 3rd Edition, John Wiley & Sons, Inc., New York, 1990.

Jang, S.P., et al., "Cooling Performance of Mircochannel Heat Sinks with Nanofluids," *Applied Thermal Engineering* 26 (2006) pp. 2457-2463.

Karthikeyan, N. R., et al., "Effect of Clustering on the ThermalConductivity of Nanofluids," Article in Press, *Mater. Chem. Phys*. 2007,doi:10.10161j.matchemphys.(2007).10.029.

Keblinski P., et al., 2002, "Mechanisms of Heat Flow in Suspensions of Nano-Sized Particles(Nanofluids)," *Int. J. Heat Mass Trans*. 45: pp. 855-863.

Lee, S, et al., "Measuring Thermal Conductivity of Fluids Containing Oxide Nanoparticles", *ASME J. Heat Transfer* 1999:121:280-9.

McCants, Evaluating the Thermal Characteristics of Copper-II and Zinc-Oxide Nanofluids Flowing over a Heated Flat Plate, 2008 ASME Summer Heat Conference, Aug. 10-14, 2008.

Munson, Bruce R., et al., *Fundamentals of Fluid Mechanics*, 4th Edition, John Wiley & Sons, Inc., New York, 2002.

Nguyen, C.T., et al., "Viscosity data for A1203-water nanofluidhysteresis: is heat transfer enhancement using nanofluids reliable?", *International Journal of Thermal Sciences* 47 (2008) pp. 103-1, 11.

Plelan, P. E., et al., "Enhanced Heat and Mass Transfer in Nanofluids," Int. Heat Transfer, Conference, 2006, 13, p. 8.

Santra, et al., "Study of Heat Transfer Augmentation in a Differentially Heated Square Cavity Using Copper-Water Nanofluid", Article in Press, *International Journal of Thermal Sciences*, (2007).

Trisaksri, et al., "Critical Review of Heat Transfer Characteristics of Nanofluids", *Renewable and Sustainable Energy Reviews* 11 (2007), pp. 512-523.

Wen, et al., "Experimental Investigation Into Convective Heat Transfer at the Entrance Region Under Laminar Flow Condition," (2004), *Int. J. Heat Mass Transfer*, 47 (24), pp. 5181-5188.

Williams, et al., "Experimental Investigation of Turbulent Convective Heat Transfer and Pressure Loss of Alumina/Water and Zirconia/Water Nanoparticle Colloids (Nanofluids) in Horizontal Tubes", *ASME, J. heat Transfer*, 2008: 130, pp. 1-7.

Xuan, et al., Investigation on Convective Heat Transfer and Flow Features of Nanofluids, *ASME, J. Heat Transfer*, 125, pp. 151-155.

Kulkarni et al. "Application of nanofluids in heating buildings and reducing pollution", Applied Energy, 86 (2009), 2566-2573, published online May 6, 2009.

Firouzfar et al. "Energy saving in HVAC systems using nanofluids", Applied Thermal Engineering, 31 (2011) 1543-1545, published online Feb. 1, 2011.

Wen et al. "Review of nanofluids for heat transfer applications", Particuology, 7 (2009), 141-150.

* cited by examiner

Figure 5. TEM Copper II-Oxide

Figure 6. TEM of Copper II-Oxide

Figure 7. TEM of Zn-Oxide

Figure 8. Baseline Data for Water

Figure 9. Heat Transfer Coefficient for CuO Various Nanoparticle Concentrations

Figure 10. Heat Transfer Coefficient for CuO Various Nanoparticle Concentrations Figure 11. Heat Transfer Coefficient for ZnO Various Nanoparticle Concentrations Figure 12. Local Heat Transfer Coefficient along Length of Plate (.03 volume-percent)

Figure 13 Local Heat Transfer Coefficient along Length of Plate (.01 volume-percent)

NANOFLUIDS FOR THERMAL MANAGEMENT SYSTEMS

PRIORITY INFORMATION

The present application claims priority to U.S. Provisional Patent Application Ser. No. 61/161,822 filed on Mar. 20, 2009 titled "Nanofluids for Thermal Management Systems" of McCants, the disclosure of which is incorporated by reference herein.

GOVERNMENT SUPPORT CLAUSE

The present invention was made with government support under FA4819-07-D-0001 awarded by the Air Force Research Laboratory. The government has certain rights in the invention.

BACKGROUND OF THE INVENTION

The quest for thermal systems that are more efficient in removing heat is never ending, with design improvements of heat exchangers being one of the main areas of focus. Water has been the working fluid of choice for years for several reasons; it is clean, readily available and has fairly good thermal properties for heat removal. Over a century ago micro-sized particles with high thermal conductivity were investigated as a way to increase the thermal characteristics of working fluids.

However, micro-sized particles can be abrasive and can precipitate out due to their higher density. Nano-sized particles introduced into a base liquid have also been studied and called "nanofluid". This concept of using copper, aluminum, or carbon nanoparticles to create colloidal suspension fluids has been accepted as a new avenue for enhancing coolant's thermal characteristics. Because heat transfer enhancements are due to particle size and dispersion isometry; the key technical challenge in implementing this technology is to understand the fundamental physics responsible for enhancing the transport of heat, which can lead to the knowledge based development of a stable nanofluid with maximum thermal conductivity.

Due to the necessity of compact thermal management systems many researchers have begun to investigate the benefits of the nanofluids on the heat transfer in the thermal management system. Scientists have reported varying degrees of increase in thermal performance with the addition of the nanoparticles to the thermal fluid. The earlier studies were primarily on the enhancements of the thermal conductivity. Most studies reported very good enhancements of the thermal conductivity even with small volume percent concentrations. Researchers have investigated the addition of nanoparticles made of highly conductive materials such as aluminum, carbon, diamond and copper with varying positive results.

Many prior researchers have focused on the use of copper (II) oxide (CuO) nanoparticles to form the nanofluid due to the favorable thermal properties of copper (II) oxide powders. However, nanofluids formed with copper (II) oxide suffer from several drawbacks that can impede its commercial use in a thermal system. For example, fluids containing copper (II) oxide nanoparticles have a tendency to mix with and retain air and oxygen within the fluid, which adversely affects the thermal properties of the fluid and can create problems in the thermal system. Additionally, the copper (II) oxide nanoparticles tend to agglomerate and/or stick to the container of the fluid in the thermal system, which can lead to impairment and fouling of fluid flow in the system.

As such, a need currently exists for a commercially viable nanofluid that can be easily mass produced, has effective thermal properties, and is relatively stable during use.

SUMMARY

Objects and advantages of the invention will be set forth in part in the following description, or may be obvious from the description, or may be learned through practice of the invention.

A nanofluid is generally provided for use in a heat transfer system. The nanofluid can include nanoparticles suspended in a base liquid at a nanoparticle concentration in the nanofluid of about 0.01% to about 5% by volume. The nanoparticles can include zinc-oxide nanoparticles. The nanofluid for use in a heat transfer system can, in one embodiment, consist essentially of zinc-oxide nanoparticles suspended in a base liquid containing a surfactant at a nanoparticle concentration of about 0.01% to about 5% by volume. In one particular embodiment, the nanofluid for use in a heat transfer system can consist of zinc-oxide nanoparticles suspended in water at a nanoparticle concentration of about 0.01% to about 5% by volume.

A thermal management system configured to cool a computer having integrated circuits that generate heat during use is also provided. The thermal management system can include a zinc-oxide nanofluid circulated through a series of tubes via a pump such that heat produced by electronic components of the computer can be captured by the circulating nanofluid and then removed from the nanofluid by a radiator.

Other features and aspects of the present invention are discussed in greater detail below.

BRIEF DESCRIPTION OF THE DRAWINGS

A full and enabling disclosure of the present invention, including the best mode thereof to one skilled in the art, is set forth more particularly in the remainder of the specification, which includes reference to the accompanying figures, in which.

Repeat use of reference characters in the present specification and drawings is intended to represent the same or analogous features or elements of the present invention.

Nomenclature

As used herein, the prefix "nano" refers to the nanometer scale (i.e., from about 1 nm to about 999 nm). For example, particles having an average diameter on nanometer scale (i.e., from about 1 nm to about 999 nm) are referred to as nanoparticles. Particles having a size of greater than 1,000 nm (i.e., 1 µm) are generally referred to as "microparticles", since the micrometer scale generally involves those particles having an average diameter of greater than 1 µm.

The term "nanofluid" refers to a fluid created by introducing nanoparticles introduced into a base liquid, and is generally characterized as a suspension of the nanoparticles in the base liquid.

In the present application, the following symbols may be used:
A area $[m^2]$
Cp specific Heat $$\left[\frac{J}{kg \cdot K}\right]$$

d diameter [m]
h convective heat transfer coefficient $$\left[\frac{W}{m^2 \cdot K}\right]$$

k conductivity $$\left[\frac{W}{m \cdot K}\right]$$

n Power-law coefficient [dimensionless]
Nu Nusselt Number [dimensionless]
Pr Prandtl Number [dimensionless]
Re Reynolds Number [dimensionless]
V velocity $$\left[\frac{m}{s}\right]$$

Greek Symbols
δ boundary layer [m]
ρ density $$\left[\frac{kg}{m^3}\right]$$

µ viscosity $$\left[\frac{N}{s \cdot m^2}\right]$$

Subscripts
cl centerline
l laminar
nf nanofluid
s solid
t turbulent
x distance

Chemical elements are discussed in the present disclosure using their common chemical abbreviation, such as commonly found on a periodic table of elements. For example, hydrogen is represented by its common chemical abbreviation H; helium is represented by its common chemical abbreviation He; and so forth.

DETAILED DESCRIPTION

Reference now will be made to the embodiments of the invention, one or more examples of which are set forth below. Each example is provided by way of an explanation of the invention, not as a limitation of the invention. In fact, it will be apparent to those skilled in the art that various modifications and variations can be made in the invention without departing from the scope or spirit of the invention. For instance, features illustrated or described as one embodiment can be used on another embodiment to yield still a further embodiment. Thus, it is intended that the present invention cover such modifications and variations as come within the scope of the appended claims and their equivalents. It is to be understood by one of ordinary skill in the art that the present discussion is a description of exemplary embodiments only, and is not intended as limiting the broader aspects of the present invention, which broader aspects are embodied exemplary constructions.

The present disclosure is generally directed to a nanofluid for use in a heat transfer system. Specifically, zinc-oxide nanoparticles can be combined with a base liquid to form a nanofluid. The resulting zinc-oxide nanofluid has good thermal properties without several of the drawbacks of previous nanofluids, such as copper (II) oxide nanofluids. For example, the zinc-oxide nanofluid is a relatively stable fluid. Additionally, the zinc-oxide nanoparticles do not significantly agglomerate or stick to the container of the fluid, thus avoiding fluid flow problems associated with the use of copper (II) oxide nanofluids.

Because the amount of heat transfer through the nanofluid relies of the thermal properties of the nanoparticles in the nanofluid, it was expected that a zinc-oxide nanofluid would have reduced thermal transfer properties compared to a copper (II) oxide nanofluid with the same concentration of nanoparticles (i.e., an otherwise identical nanofluid but for the copper (II) oxide nanoparticles instead of the zinc-oxide nanoparticles). This expectation is based on the fact that the zinc-oxide nanoparticles have a lower thermal conductivity than copper (II) oxide nanoparticles. However, the present inventor has surprisingly found that despite the lower thermal conductivity as a solid powder, the zinc-oxide nanoparticles can be used to form a nanofluid having similar thermal properties than copper (II) oxide nanofluids without substantially realizing the drawbacks of these copper (II) oxide nanofluids.

Certain properties of the zinc-oxide nanoparticles can be varied to control the properties of the resulting nanofluid. For example, the shape of the zinc-oxide nanoparticles, the size of the zinc-oxide nanoparticles, and/or the concentration of the zinc-oxide nanoparticles can be varied to control the properties of the resulting zinc-oxide nanofluid.

In one embodiment, the zinc-oxide nanoparticles can have an average diameter of about 1 nm to about 500 nm, such as about 50 nm to about 250 nm. For instance, the zinc-oxide nanoparticles can have an average diameter of about 100 nm to about 200 nm, such as about 125 nm to about 175 nm.

The zinc-oxide nanoparticles may agglomerate when in base fluid. The agglomerations formed from agglomerating zinc-oxide nanoparticles can be 2 to 10 times the dry particle size, such as about 2 to about 5 times the dry particle size. Thus, while the zinc-oxide nanoparticles may agglomerate, the size of the formed agglomerations may not adversely affect the flow of the nanofluid.

The amount and size of the agglomerations formed in the nanofluid can be controlled with the addition of a surfactant. Since a nanofluid is essentially a suspension of nanoparticles in the base liquid, a surfactant can help stabilize the nanofluid and inhibit precipitation of the nanoparticles from the base liquid. Additionally, a surfactant may add stability to the nanofluid, such as 1-dodecane sulfonic acid or its salt (e.g., sodium 1-dodecane sulfonic acid). In one embodiment, the surfactant can have a surfactant concentration of about 0.1% to about 5% by volume, such as about 1% to about 4% by volume.

Generally, the shape of zinc-oxide nanoparticles can vary. In some embodiments, the zinc-oxide nanoparticles may be substantially spherical in shape.

The concentration of the zinc-oxide nanoparticles in the resulting nanofluid can be from a positive amount (e.g., about 0.01%) to about 5% by volume, such as about 1% to about 4.5% by volume. In some embodiments, the concentration of the zinc-oxide nanoparticles in the nanofluid can be about 1.5% to about 4% by volume, such as about 2% to about 3.5% by volume. The use of these particular volumes can provide the zinc-oxide nanofluid with sufficient thermal transfer characteristics while allowing the fluid to sufficiently flow in the heat transfer system.

In one particular embodiment, the zinc-oxide nanoparticles can be the only type of nanoparticle in the nanofluid. Thus, the nanofluid can, in one embodiment, consist essentially of zinc-oxide nanoparticles without other metal oxide nanoparticles substantially present, such as copper oxide (CuO) nanoparticles, silicon oxide ($Si_2O$) nanoparticles, aluminum oxide ($Al_2O_3$) nanoparticles, etc. The nanoparticles in the nanofluid can, for example, consist of the zinc-oxide nanoparticles without any other metal oxide nanoparticles present.

The base liquid for use with the zinc-oxide nanoparticles to form the nanofluid is, in one embodiment, water (e.g., distilled water). In certain embodiments, the base liquid can be water without combination with other liquids (i.e., the base liquid can consist essentially of water). Alternatively, other base liquids can be used as desired, such as ethylene glycol (or anti-freeze) either alone or in combination with water.

Other additives can be included in the base liquid to form the nanofluid. For example, a microbe growth inhibiting agent can be included in the nanofluid to inhibit grow of microorganisms (e.g., bacteria, fungi, archaea, protists, etc).

However, in one particular embodiment, microbe growth inhibiting agents can be omitted from the nanofluid (i.e., the nanofluid can be free from any microbe growth inhibiting agents) while still inhibiting the growth of microorganisms because microbe growth inhibiting agents are not necessary with zinc oxide. The zinc oxide particles themselves have been discovered to sufficiently inhibit microorganism growth. For instance, the nanofluid can, in one embodiment, consist essentially of the base fluid(s) and the nanoparticle(s) and, optionally, a surfactant without any other additives substantially present. In one particular embodiment, the nanofluid can consist of the base fluid(s) and the nanoparticle(s) and, optionally, a surfactant without any other additives present.

Figure 3:
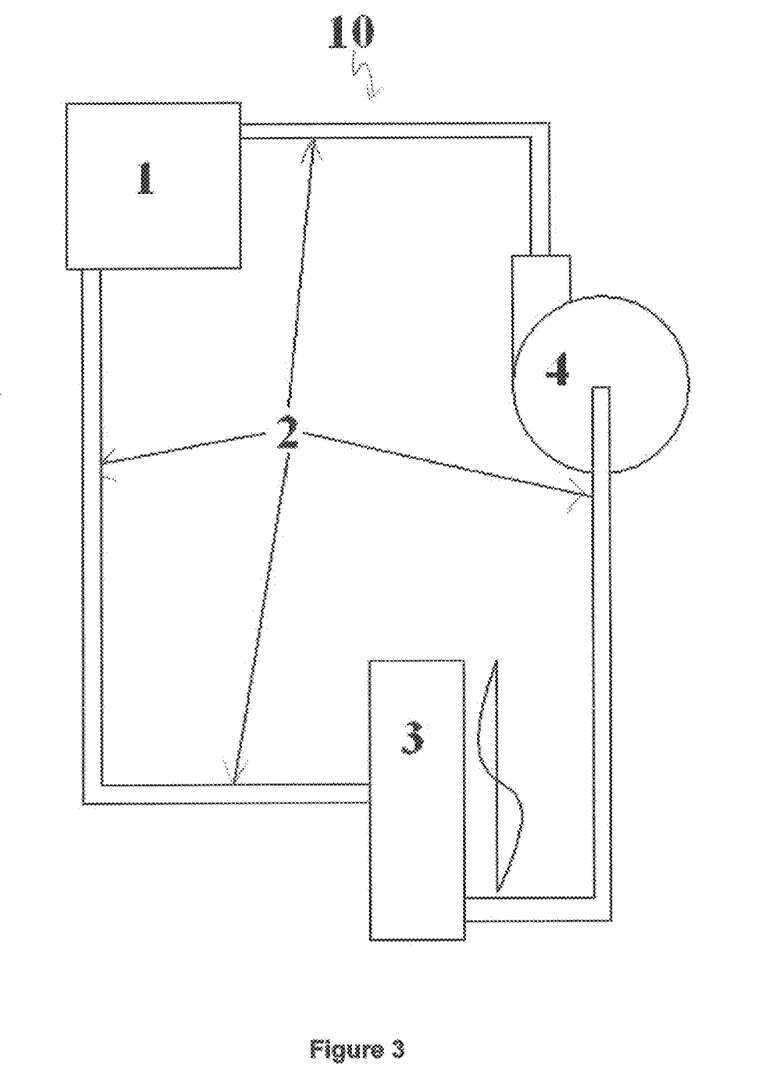
FIG. 3 shows a schematic of an exemplary thermal transfer system used to cool a computer.

The zinc-oxide nanofluid of the present invention can be utilized in a heat transfer system to thermally manage a number of products and systems. In one particular embodiment, the zinc-oxide nanofluid can be utilized in a heat transfer system configured to thermally manage the temperature of electronic parts of a computer system. For example, a computer system, as shown in FIG. 3, contains many electronic parts that can be thermally managed by a heat transfer system utilizing a zinc-oxide nanofluid. As the power density increases in each of the component's processors, it will be necessary to remove the excess heat generated by each device. During operation of a computer power is supplied to the electronics by means of a power supply. As a result of inefficiencies in the circuits, not all of the supplied power is used by the components, and the unused power is typically released as heat. As computer electronics become better designed and the power density increases the amount of heat generated will increase. Also, as the computers become faster by operating at higher frequencies the components will also get hotter. This will result in the need to remove more heat than is currently needed as excessive heat can damage components.

In one embodiment, the zinc-oxide nanofluid can be used in a thermal management system configured to cool a computer. For example, a computer system composed of integrated circuits generating heat can be connected to a thermal management system which removes such generated heat. This thermal management system can include a water block (s), tubing, pump and radiator. The water block(s) remove the heat from specific electronic components, the tubing is used to transfer the working thermal fluid to each of the components that are to be water cooled. The pump moves the thermal fluid to each of the components contained within the cooling loop. Finally, the radiator dissipates the heat removed from the electronic components into the surrounding air by means of a fan.

In such a system, the zinc-oxide nanofluid is moved around the thermal system through a series of tubes. A pump provides the necessary pressure to move the fluid. Excessive heat produced by the electronic components is captured by the nanofluid, then this heat is removed by the radiator. The radiator dissipates the heat into the surrounding air by the use of a fan. The fan creates airflow over the radiator that removed the heat from the nanofluid.

The size, arrangement, and numbers of water blocks can vary, along with the size and arrangement of the tubing necessary to move the nanofluid through the thermal system. The size of the pump and radiator can also vary. The speed of the pump and fan can also vary.

An exemplary thermal transfer system 10 for cooling a desktop computer is represented in FIG. 3. The system includes a water block 1 used to remove heat from the computer, tubing 2 to transfer the liquid through the cooling loop, a radiator 3 used to remove heat from the fluid by means of blowing ambient air across the radiator with a fan, and a pump 4 to regulate the flow of the liquid.

Figure 4:
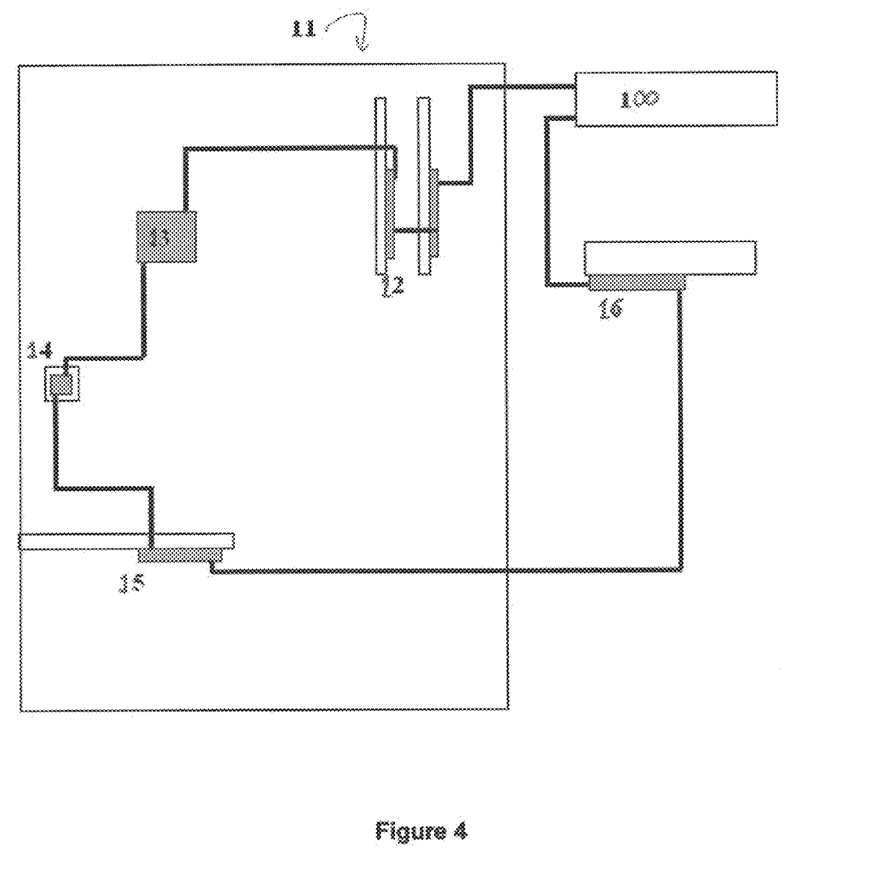
FIG. 4 shows a schematic of an exemplary thermal transfer system having a cooling loop to cool multiple computer components.

Another exemplary thermal transfer system 11 for cooling multiple components in a desktop system is shown in FIG. 4. This system 11 includes a pump and radiator 100 as shown in FIG. 3. Also, the system 11 includes RAM water blocks 12, a CPU water block 13, a north bridge water block 14, a video card water block 15, and a hard drive water block 16.

In one embodiment, the use of the zinc based nanofluid to increase the amount of heat transfer capable of the thermal management system can also have the benefits of being able to reduce the size of the radiator, reduce the fan speed, and/or reduce the fluid pump speed. The reduction in pump speed would cause a decrease in the amount of power necessary to thermally manage the computers enabling the system to be classified as a 'green' system. The reduction in fan speed of numerous fans used in the thermal management of many computers would decrease the level of noise pollution. The reduction in the radiator would lessen component cost and the overall footprint of the thermal management system.

The use of a zinc based nanofluid in the thermal management system can reduce or eliminate the need replace the fluid. The nanoparticles cannot disintegrate, and with the addition of a microbial growth inhibitor the fluid will not have any significant microbial growth. Therefore, pending no construction/component mishaps, the fluid can remain effective over the lifetime of the system.

In one or more of the embodiments of this invention, the water block will use the thermally efficient nanofluid with thermally conductive nanoparticles to remove heat from specific heat generating components. The components chosen to be cooled by the nanofluid are user-specified in that each specific user will determine which components involved in his or her computer system most will benefit from the cooling by the nanofluid.

EXAMPLES

Figure 1:
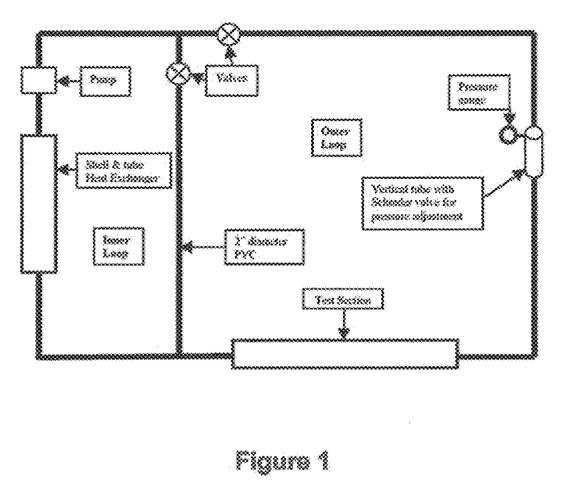
FIG. 1 shows a schematic of the test loop used in the Examples.

Laboratory experiments involving nanofluid flow over a heated flat plate were conducted to ascertain the thermal enhancements of the nanofluid. The test loop can be seen in FIG. 1.

The test setup included a PVC loop with an centrifugal pump (AMT, A Subsidiary of The Gorman-Rupp Company, Royersford, Pa., model XSS 2×1.5NPT 5HP) test section, liquid cooled shell and tube heat exchanger (ITT Standard, Buffalo, N.Y., model BCF), a data acquisition system (National Instruments, Austin, Tex.), and a GE Panametrics AT 868 flow velocity meter (General Electric Company).

This test loop was comprised of two flow-loops. The outer loop contained the test section, while the inner loop was used as a fluid bypass in order to control the velocity through the test section. By closing and opening valves it was possible to control the flow rate through the text section. The test loops were made from 2 inch diameter clear PVC tubing. The heat exchanger was used to maintain desired test section inlet temperature. LabVIEW was used to control the inlet temperature and measure the temperature of the heated plate at equal positions along the plate centerline. LabVIEW was also used for the numerical analysis of the data.

De-ionized water was used as the working fluid. The DI water's properties were assumed to remain constant during the experiment. The system was pressurized to ensure no cavitation occurred from the pump impeller or heat exchanger. The fluid velocity was measured by a GE Panametrics flow meter and a model PX2300-1 DI pressure transducer from Omega. LabVIEW was used to record the fluid velocities for the GE flow meter, and it was used to record the voltage from the pressure transducer. The measured fluid velocities were verified with a manometer.

Figure 2:
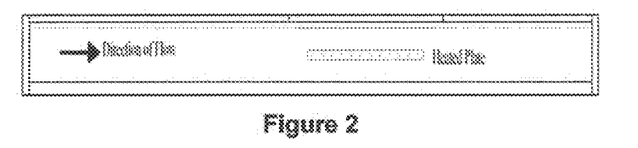
FIG. 2 shows an exploded view of components of the test loop of FIG. 1.

The square test section was made from 0.0127 m thick high clarity lexan. The test section measured 1.0668 m×0.0508 m×0.0508 m. FIG. 2 shows a schematic of the test section.

The heated copper plate had the dimensions 0.2286 m×0.0508 m×0.0127 m. It had twelve 120V cartridge heaters inserted into the side of the plate at equal distances. 220V was used as the power supply for the cartridge heaters. This enabled more energy to be put into the plate. 13 channels were machined from the edge to the centerline at a depth of 1.6 mm in the top of the copper plate in order to insert thermocouples. After inserting the thermocouple the channels were then filled with an epoxy. The plate was re-machined to a flat surface. In order to prevent the plate from reflecting the laser it was painted with black, non-reflective, high temperature paint.

A typical data collection involved a specific Reynolds number, a specific heat input, and a known weight-percent of nanoparticles added to the working fluid. LabVIEW was used to record the temperature of the fluid entering the test section, the temperature of the plate at a specific distance and was also used to compute fluid properties at the film temperature, the measured heat transfer coefficient. These data points were recorded at various Reynolds numbers and compared to baseline experimental data to ascertain what effect the nanoparticles had on the thermal characteristics of the fluid.

TEM and DLS Measurements

Figure 5:
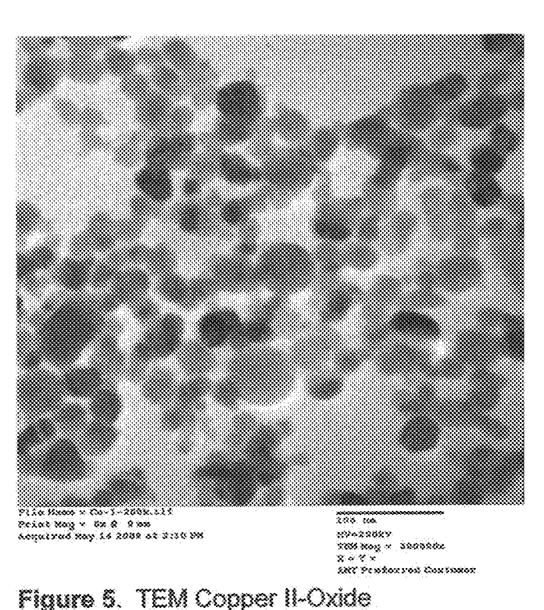
FIGS. 5 and 6 show photographs from a transmission electron microscope (TEM) of a copper-II-oxide nanofluid according to the Examples.
Figure 6:
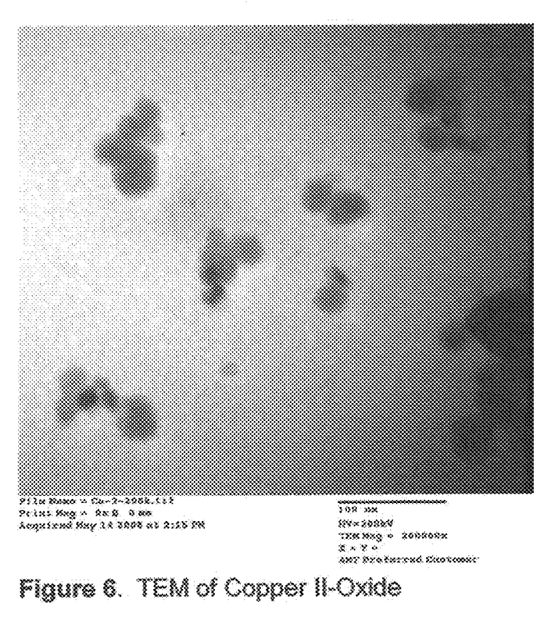
Figure 7:
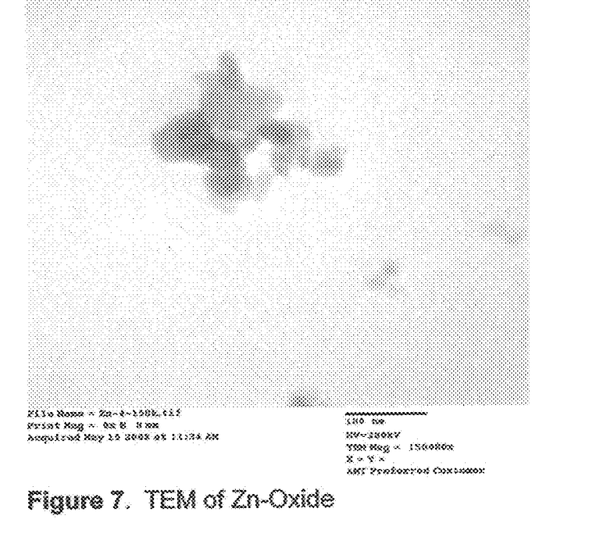
FIG. 7 shows a photograph from a transmission electron microscope (TEM) of a zinc-oxide nanofluid according to one Example.

A Transmission Electron Microscope (TEM) was used to investigate particle size and agglomeration. In order to prepare the samples for viewing under the TEM it was necessary to place a small sample on a sample-sheet. This sample was then allowed to dry which could have influenced the agglomeration. FIGS. 5, 6 and 7 are photographs taken with a TEM.

FIGS. 5-7 show that the individual nanoparticles were the correct size as sold by the manufacturer. However, the particles were agglomerated and actual effective particle size was much larger. To investigate whether the drying process was affecting the particle measurements taken by the TEM a dynamic light scattering system DLS was used to measure the mean particle size as it was in the liquid. After experiments were run with the nanofluids a small sample of the fluid was taken for mean particle size measurement. The mean particle size in the Copperil-Oxide nanofluid was found to be 171.3 nm, and the mean particle size in the Zinc-Oxide was found to be 150.41 nm. This showed that agglomeration was occurring in the fluid.

Results and Discussion

To measure the convective heat transfer coefficient of water it was necessary to measure the fluid velocity within the test section. A pitot tube was used to measure the centerline pressure of the test loop. The measurement of the pressure was made by a pressure transducer and verified by a manometer. From this pressure the centerline velocity could be calculated. From the centerline velocity the centerline Reynolds number could be calculated. Using the exponent power-law profile graph the exponent n was obtained. Finally, using the centerline velocity and the exponent n the average velocity in the test loop could be obtained.

$$\bar{V} = \frac{2n^2}{(n+1)(2n+1)} U_{cl} \qquad (1)$$

In order to obtain the velocity within the test section itself it was necessary to adjust for area differences. This was done by setting the volumetric flow rate equal to each other and adjusting for the area.

$$\bar{V}_{TestSection} = \frac{(\bar{V} \cdot A)_{TestLoop}}{A_{TestSection}} \qquad (2)$$

This velocity was used to calibrate the GE Panametrics flow meter. The velocity from the GE Panametrics flow meter was read into LabView which dynamically calculated the local Reynolds number, $Re_x$. This Reynolds was used to define the measurement points.

With the addition of nanoparticles to the working fluid it was necessary to adjust the viscosity and density of the nanofluid. This was done by taking into account the volume fraction of the nanoparticles and its relationship to the overall density and viscosity. [Zeinali 2005] The viscosity was measured in house at room temperature The viscosity was then adjusted to the film temperature based on the percentage change of water from room temperature to the film temperature. Zeinali's [2005] equation for density was used to modify the nanofluid's density.

$$\rho_{nf} = \nu\rho_s(1-\nu)\rho_w \quad (3)$$

And the Reynolds number was calculated using equation 4.

$$Re_x = \frac{\rho_{nf} \bar{V}_{TestSection} X}{\mu_{nf}} \quad (4)$$

Knowing the properties it was then possible to run experiments and obtain thermal characteristic data of the nanofluid. In order to compare the measured thermal characteristics a baseline measurement of water was necessary.

The baseline measurement of the local heat transfer coefficient was performed at 0.135 meters down the plate. Temperature measurements were taken at a series of local Reynolds numbers varying from 15,000 to 370,000. At each Reynolds number the fluid inlet temperature and plate temperature at 0.135 meters was recorded. Using the known power input and area of the plate, the local convective coefficient was calculated. These values were plotted against the Reynolds number.

Based on the known quantity of water held by the system the amount of nanoparticles added to the fluid to obtain various volume-percents was calculated. Nanofluid from Nanophase Technologies was added to the base fluid making the highest concentration by volume-percent first. After each experiment the nanofluid was diluted with a calculated amount of de-ionized water, and the tests were repeated. The volume-percents investigated were concentrations in descending order. The measured convective coefficients were plotted and compared to the measured convective coefficient of the water with no nanoparticles.

Copper-II-Oxide Nanofluid

As mentioned above, Nanophase Technologies provided the copper II-oxide nanofluid that was used in the experiment. The concentration of copper II-oxide ranged from 0.2-3.0 volume percent. For the higher concentrations it can be seen in FIG. 6 that the heat transfer coefficient increased in all concentrations. At 3.0 Vol % with the greatest increase was found to be 16% at Reynolds number 209,000. The 2.0 Vol % showed a comparable trend in the increase of the heat transfer coefficient, with a maximum increase of 13% at Reynolds number 290,000. The 1.0 Vol % also showed a comparable trend with the maximum increase of 11%.

For the lower Copper nanofluid concentrations the heat transfer was not as pronounced as the higher concentrations as can be seen in FIG. 7. The increase in the heat transfer coefficient was small but consistent across the range of Reynolds numbers. No order to the maximum increase in the heat transfer coefficient was found with the lower volume percent concentrations as was found with the larger volume percent concentrations. The largest increase for the lower concentrations was 8.2% for the 0.2 V % at a Reynolds number of 205,000.

Zinc-Oxide Nanofluid

Figure 8:
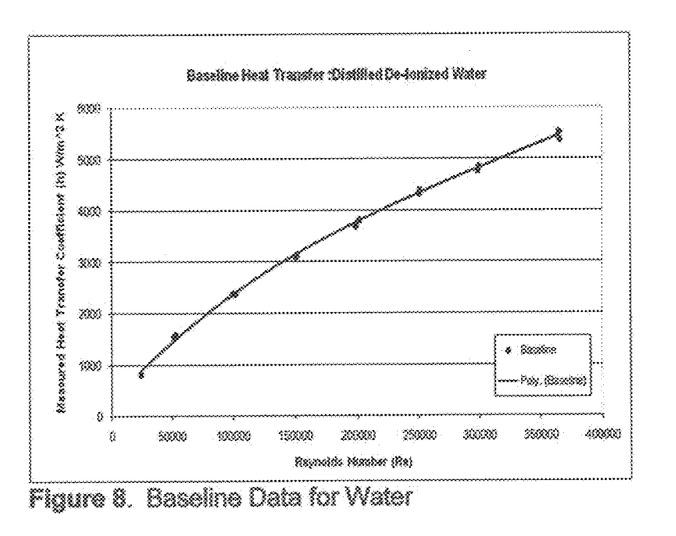
FIG. 8 shows the baseline heat transfer data for distilled de-ionized water according to the Examples.
Figure 9:
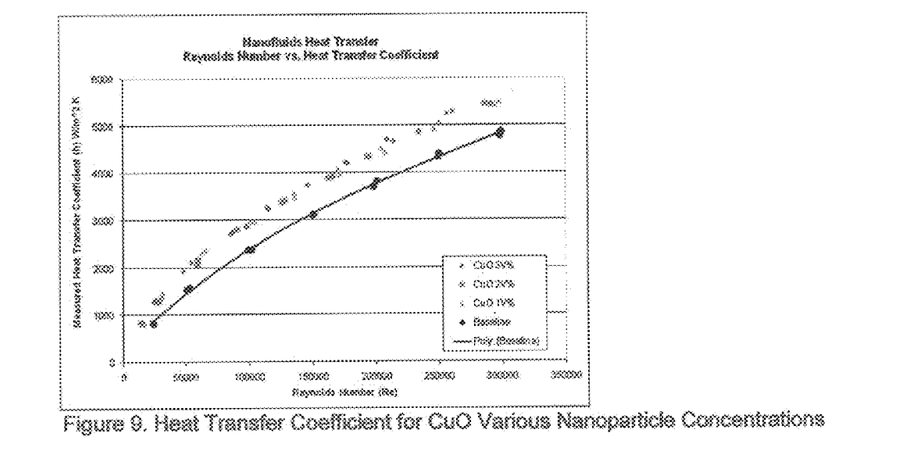
FIGS. 9 and 10 show the baseline heat transfer data for CuO nanofluids at various concentrations according to the Examples.
Figure 10:
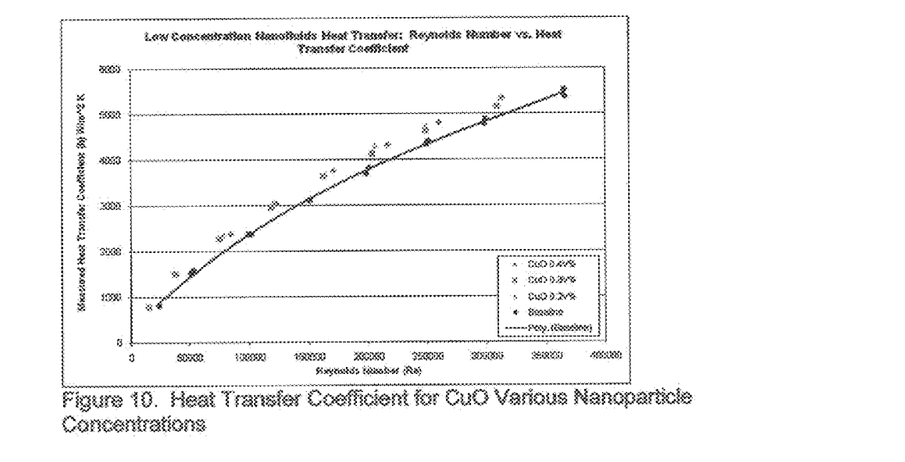
Figure 11:
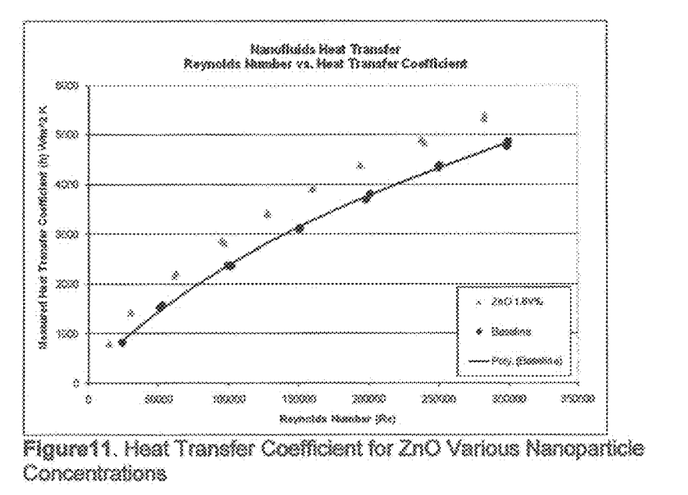
FIG. 11 shows the baseline heat transfer data for zinc-oxide nanofluids according to the Examples.

The Zinc-Oxide followed in the same trends as did the CopperII-Oxide as can be seen in FIG. 8. There was an increase in the heat transfer coefficient, but of the two nanofluids investigated it had the smallest amount of increase. For the Zinc 1.6 Vol % showed a comparable trend in the increase of the heat transfer coefficient, with a maximum increase of 13% at Reynolds number 201,000.

Figure 12:
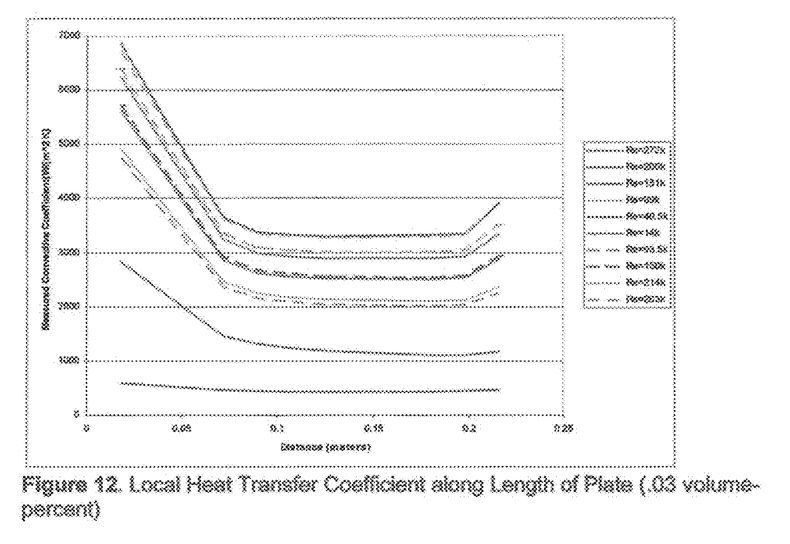
FIGS. 12 and 13 show local heat transfer coefficients along the length of the plate according to the examples.
Figure 13:
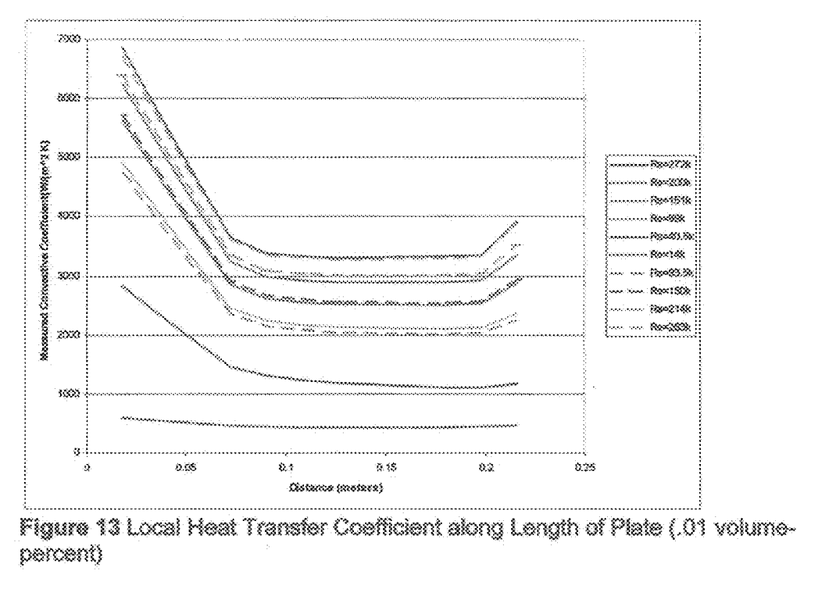

The convective heat transfer coefficient was plotted along the length of the plate. This was accomplished by recording the temperature with thermocouples placed at equal distances down the length of the plate. The following two figures show how the convective coefficient varied along the length of the plate at two different concentrations. As the fluid velocities increased there was a flow separation towards the end of the plate, as can be seen at the higher Reynolds numbers in the figures below.

CONCLUSIONS

Through an investigation of the heat transfer characteristics of a fluid containing nanoparticles it was found that an enhancement in the convective heat transfer coefficient did occur. This was found to be a maximum of 16% measured at a local Reynolds number of 209000. The table below summarizes the maximum percent increase in the convective heat transfer coefficient for each of the high volume-percents investigated.

TABLE 1

Summary of the Maximum Increase in Convective Heat Transfer

| NanoFluid | Volume % | Reynolds Number | % Increase over Water |
|---|---|---|---|
| CuO | 3.0 | 209000 | 16.0 |
| CuO | 2.0 | 289000 | 13.6 |
| CuO | 1.0 | 295000 | 11.0 |
| ZnO | 1.6 | 201000 | 13.0 |

It is possible that the agglomeration of the nanoparticles in the fluid negatively affect the heat transfer. The possibility exists that the increases would have been larger if particle size was smaller. The measurements for the Reynolds number are particularly sensitive to values of the viscosity; therefore measuring the viscosity in the range of temperatures tested may yield improved results.

These and other modifications and variations to the present invention may be practiced by those of ordinary skill in the art, without departing from the spirit and scope of the present invention, which is more particularly set forth in the appended claims. In addition, it should be understood the aspects of the various embodiments may be interchanged both in whole or in part. Furthermore, those of ordinary skill in the art will appreciate that the foregoing description is by way of example only, and is not intended to limit the invention so further described in the appended claims.

What is claimed:

1. A nanofluid for use in a heat transfer system, the nanofluid consisting of zinc-oxide nanoparticles suspended in water, wherein the zinc-oxide nanoparticles have a nanoparticle concentration in the nanofluid of about 0.01% to about 5% by volume, and wherein the zinc-oxide nanoparticles have an average diameter of about 125 nm to about 175 nm, and further wherein the nanoparticles agglomerate in the base fluid to be about 2 to about 10 times the average diameter of the nanoparticles.

2. The nanofluid as in claim 1, wherein the nanoparticle concentration is about 1% to about 4.5% by volume.

3. The nanofluid as in claim 1, wherein the nanoparticle concentration is about 2% to about 3.5% by volume.

4. The nanofluid as in claim 1, wherein the nanofluid is free from a microbe growth inhibiting agent.

5. A thermal management system configured to cool a computer having integrated circuits that generate heat during use, the thermal management system comprising the nanofluid of claim 1 circulated through a series of tubes via a pump, wherein heat produced by electronic components of the computer is captured by the circulating nanofluid and then the heat is removed from the nanofluid by a radiator.

\* \* \* \* \*